United States Patent [19]

Christ et al.

[11] 4,167,413
[45] Sep. 11, 1979

[54] MAKING HYBRID IC WITH PHOTORESIST LAMINATE

[75] Inventors: Allen E. Christ, Scottsdale; Dennis R. Sprague, Mesa; Bernhard A. Ziegner, Gilbert, all of Ariz.

[73] Assignee: Motorola, Inc., Schaumburg, Ill.

[21] Appl. No.: 851,247

[22] Filed: Nov. 14, 1977

[51] Int. Cl.² .............................................. G03C 5/00
[52] U.S. Cl. ........................................ 96/36.2; 96/36; 156/293; 156/630; 156/634; 156/659; 427/96; 427/238; 427/239
[58] Field of Search ........................ 96/36, 36.2, 86 P; 156/293, 299, 630, 634, 659, 583; 427/96, 238, 239

[56] References Cited
U.S. PATENT DOCUMENTS 2,736,065  2/1956  Wilcox ............................ 156/293
3,959,061  5/1976  Renck et al. ................... 156/293 X

OTHER PUBLICATIONS

DeForest, "Photoresist, Materials and Processes," Jun. 1975, pp. 176-178, esp. p. 177.

Primary Examiner—Edward C. Kimlin
Attorney, Agent, or Firm—John A. Fisher

[57] ABSTRACT

A hybrid integrated circuit package and a method for fabricating the package. The package comprises a ceramic substrate having a blank metallization and feedthroughs screen printed thereon. A ceramic seal ring is joined to the substrate to form the side walls of the package. The substrate metallization is plated with nickel and gold and external leads are brazed to the ends of the feedthroughs. As such the package is suitable for use with a large number of different integrated circuits. The package can be adapted for use with a particular integrated circuit function by selectively patterning the blank substrate metallization. This is accomplished by laminating a preformed piece of dry film photoresist material to the package bottom. This piece of photoresist is then exposed through a photographic mask using a collimated light source.

4 Claims, 7 Drawing Figures

MAKING HYBRID IC WITH PHOTORESIST LAMINATE

BACKGROUND OF THE INVENTION

This invention relates to a hermetic package for hybrid integrated circuits and to a method for making a package. More specifically, this invention relates to a package which has the flexibility to be used for a variety of integrated circuit functions.

A hybrid integrated circuit is a circuit built up from individual components in die form which may include one or more monolithic integrated circuits and one or more discrete devices. The individual integrated circuit and discrete devices, in die form, are usually mounted and interconnected in a sealed package enclosure which protects the die from physical damage and from the ambient. The package also provides external leads for electrically contacting the integrated circuit and connecting it in its intended use.

In general, the conventional hybrid integrated circuit ceramic package has a flat ceramic bottom with a ceramic seal ring attached to form the bottom and side walls of the package enclosure. The seal ring has metallized feedthroughs to provide electrical contact between the package interior and the outside world. The inner portion of these feedthroughs terminate in bonding pad areas; external leads are brazed to the outer portion of the feedthroughs to facilitate connecting the circuit to a printed circuit board or other application. The package bottom is provided with a metallized substrate attachment pad which is simply a rectangle of solderable metal screen printed or otherwise applied to the ceramic bottom. As so far described, the package is standardized and can be used for almost any circuit function. To be used for a particular circuit function, however, a patterned substrate must first be soldered or brazed to the substrate attachment pad. The patterned substrate is unique to each circuit function. It has on its surface a metallized pattern which provides die attach areas, wire bond pads, and lines for electrical interconnection. The circuit components, which may consist of monolithic integrated circuits or discrete device chips, are die bonded to the die attach areas. The chips are appropriately interconnected by wire bonds and the metallization provided. Electrical contact between the completed circuit within the package and the outside world is accomplished by wire bonding from the patterned substrate to the feedthrough bonding pad areas. The circuit function on the substrate is thus connected to the external leads via wire bonds and the feedthroughs provided on the seal ring. The hermetic package is completed by soldering a metal or ceramic lid to the top of the seal ring. This package has the disadvantage that a separate substrate must be used for circuit function. Also, the additional step of attaching the substrate to the package bottom is required. Most importantly, however, wire bonds are required to complete the connection between the substrate and the external leads. The use of these additional wire bonds is expensive, time consuming, and detracts from the reliability of the circuit.

An alternate packaging technique for hybrid integrated circuits is to provide a metallized pattern directly on the bottom ceramic. This patterned bottom can take the place of the metallized and patterned substrate and can also provide the feedthrough function. The appropriate parts of the interconnect metallization pattern can be routed to the edge of the ceramic bottom where external leads can subsequently be attached by brazing. Wire bonds from the substrate to the feedthroughs are thus eliminating. The difficulty with this technique, however, is that the ceramic seal ring must be attached to the package bottom by firing at a high temperature. This is done by applying a layer or glass between the two ceramic pieces and then raising the temperature to about 900° C. or higher depending on the glass used. The choice of metals that can be applied to the package bottom is thus limited to those metals that would not be adversely affected by this high firing temperature. Some metals such as gold, which are very desirable for reasons of solderability, bondability, current carrying capability, and resistance to corrosion, cannot be used because of diffusion problems between the gold and underlying metals. Also, because the package bottom must be customized for each circuit, a different package is required for each circuit function. Hybrid integrated circuits are usually designed for very special applications. As such, the number of any particular circuit is relatively small so supplying a different package for each circuit function can be very expensive.

Accordingly a need existed to develop a hybrid integrated circuit package, including a method therefore, which would overcome the problems of prior art packages and methods to produce a reliable, low cost, flexible package.

It is an object of this invention to provide an improved hybrid integrated circuit package. The package has the flexibility to be adapted to a number of different circuit functions. A separate metallized substrate is not required and no wire bonds are required to interconnect the completed circuit function to the external leads.

It is a further object of the invention to provide a process for fabricating an improved hydrid integrated circuit package. The process permits the patterning of the package metallization to accommodate a variety of circuit functions.

SUMMARY OF THE INVENTION

In accordance with the invention, a hydrid integrated circuit package is provided which has the metallized substrate pattern directly on the package bottom. The package is fabricated with a ceramic bottom substrate. On the substrate and interior to the package is a blank, unpatterned metallization. The substrate also has metallized feedthroughs which connect this blank metallized pad to the exterior of the package. A ceramic seal ring is attached to the package bottom to form the side walls of the package enclosure. External leads can be brazed to the outer portion of the feedthroughs to complete the basic package. The basic package may then be plated with a variety of metals to optimize solderability and bondability. To customize the package to accommodate a particular integrated circuit function, the blank substrate metallization is photolithographically patterned to form an operable pattern of die attach areas, wire bond pads, and interconnect metallization.

Conventional photolithographic techniques are unsuitable for patterning the metallization at the bottom of the package. Accordingly a dry film photoresist process is provided. The dry film photoresist material is preformed to fit the package bottom. A specialized laminating tool then applies the appropriate pressure and temperature to laminate this preformed piece of dry film photoresist to the package bottom. The photoresist is then exposed through a mask using a collimated light source.

BRIEF DESCRIPTION OF THE DRAWINGS

Other objects and advantages of the invention will become apparent upon a reading of the following detailed description taken in connection with the drawings, in which.

While the invention will be described in connection with preferred embodiments, it will be understood that it is not intended to limit the invention to those embodiments. On the contrary, it is intended to cover all alternatives, modifications and equivalents as may be included within the spirit and scope of the invention as defined by the appended claims.

DETAILED DESCRIPTION OF THE INVENTION

Figure 1:
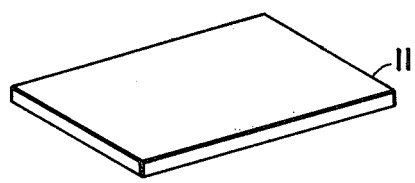
FIGS. 1 to 4 show in perspective view the steps by which one embodiment of the basic hybrid integrated circuit package is fabricated.

Turning now to the Figures, FIGS. 1-4 show the steps by which the basic hybrid integrated circuit package 10 can be fabricated in accordance with the preferred embodiment of the invention. FIG. 1 shows the ceramic material which is to be used for the bottom 11 of the integrated circuit package. The bottom 11 can be green ceramic about 20 mils in thickness and about 650 mils by 550 mils in length and width respectively. By green ceramic is meant an unfired ceramic material. The bottom 11, of course, can be made larger or smaller to accommodate different circuit functions.

Figure 2:
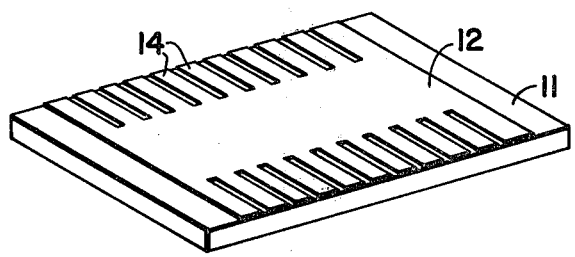

In FIG. 2 the bottom 11 has been metallized. The metal pattern, which can be applied, for example, by screen printing, is shown to consist of a blank substrate pad 12 and 22 feedthrough lines 14. This metal pattern can be formed of a refractory metal such as tungsten or a tungsten alloy.

Figure 3:
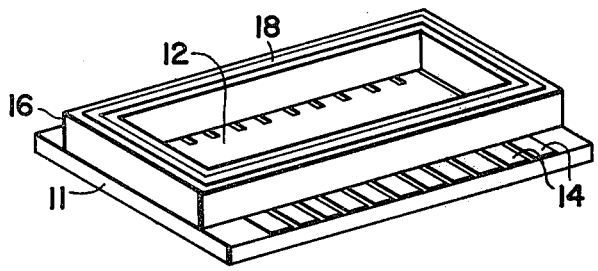

In FIG. 3 a seal ring 16 has been attached to the package bottom 11. The seal ring can also be made of green ceramic and can be about 45 mils by 40 mils in cross-sectional width and height respectively. The top surface of the seal ring 16 is metallized with a layer of tungsten or tungsten alloy metallization 18. The seal ring 16 can be joined to the bottom 11 by firing the green ceramic material at about 1500° C. The tungsten metallization pattern is unaffected by this firing temperature because of its refractory nature. After this high temperature firing operation, electrical contact can be made to the two metallized areas, the substrate metallization and the seal ring metallization 18, and the two areas can be electroplated with a suitable metallization system which will promote solderability, has good current carrying capability, and prevents corrosion. The substrate metallization, including the substrate pad 12 and the feedthroughs 14, is all electrically connected and so can be contacted during the electroplating operation with a single electrical contact. To facilitate the subsequent assembly, it is convenient to first plate with a layer of a barrier metal such as nickel and then follow with a layer of gold.

Figure 4:
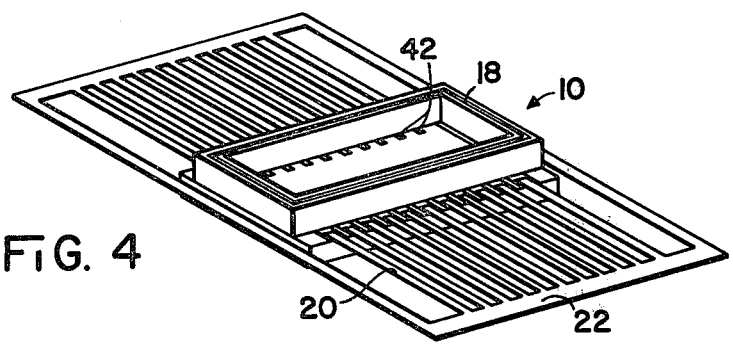

In FIG. 4 the basic package 10 is completed by connecting metal leads 20 to the feedthroughs 14, for example, by brazing. The metal leads 20 can all be part of a lead frame structure held together by a tie bar 22. After assembly of the hybrid integrated circuit within the package the tie bar 22 can be sheared off to separate the leads. The package can be sealed and rendered hermetic by soldering a metal or ceramic lid (not shown) to the metallized region 18 on the top of the seal ring.

Figure 5:
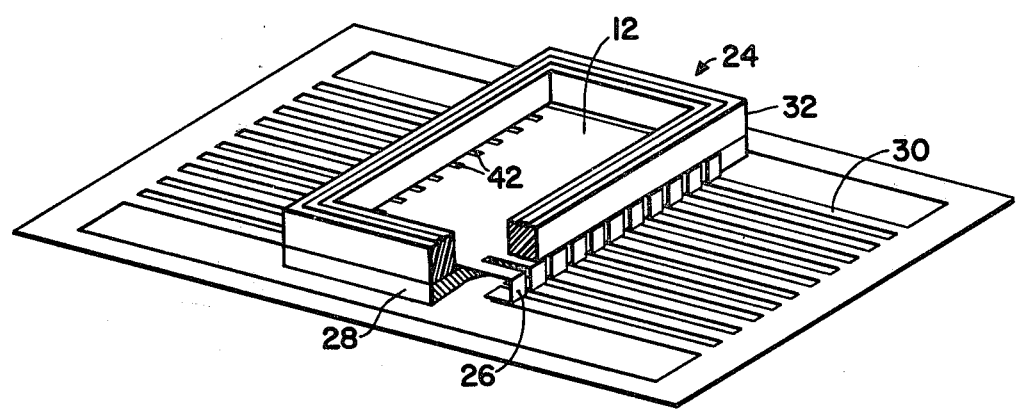
FIG. 5 shows in partially cut away perspective view an alternate embodiment of the basic package.

An alternate embodiment of the basic package is shown in FIG. 5. When metallizing the alternate package 24, the feedthroughs 26 are made to wrap around the package bottom 28. The seal ring 32 can then be attached to the package bottom 28, as before. Now, however, the leads 30 can be brazed to the feedthroughs 26 on the bottom of the package 24. The bottom 28, in this alternate embodiment, needs to be only as wide as the seal ring 32, and so package 24 can be smaller than the package 10 in FIG. 4.

The blank substrate pad 12 can now be patterned so that either package 10, 24 will accommodate any one of a large number of integrated circuit functions. Conventional photolithographic techniques are unsuitable for patterning the substrate pad 12 because the pad is positioned at the bottom of the package cavity. Conventional photolithographic techniques require that a thin, uniform layer of liquid photoresist be applied to the layer to be patterned, usually by spinning or spraying. Alternatively, a layer of dry film photoresist such as RISTON can be laminated to the object to be patterned. RISTON, a registered trademark of the E. I. DuPont deNemours and Company, is normally applied to a metal layer using controlled heat and pressure in a roller applicator. Neither of these techniques is satisfactory for the application of the photoresist to the bottom of a package enclosure. The liquid resist tends to build up in a thick layer at the intersection of the package bottom and seal ring. The roller applicator cannot adequately laminate the dry film resist to the bottom of the package because of the presence of the seal ring.

Figure 6:
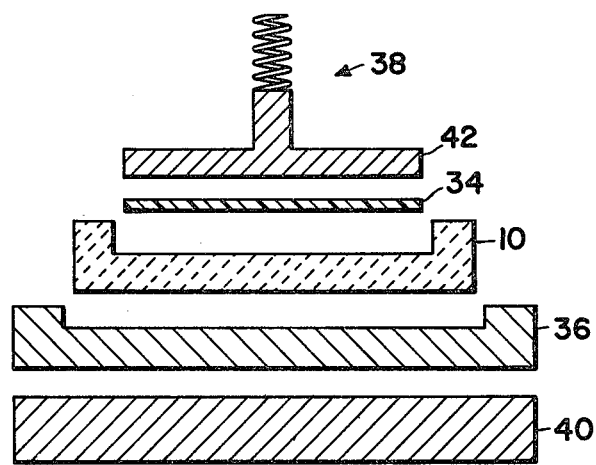
FIG. 6 shows schematically in cross section a fixture used in the patterning of the substrate metallization.

The present invention is also concerned, therefore, with a method for patterning the blank substrate metallization pad so that a single basic package can be used in conjunction with a variety of different hybrid integrated circuits. As shown schematically in FIG. 6, a preformed piece of RISTON or other dry film photoresist material 34 can be cut to a size which approximates the interior length and width dimensions of the package enclosure. The process is described with reference to the package 10 of FIG. 4, but applies equally to the alternate package 24 of FIG. 5. The preformed piece of photoresist 34 can be placed in the package 10 and the package itself placed in a recess provided in a pedestal 36. A plunger 38, shown as spring activated, then contacts the film 34 pushing it against the package 10 and simultaneously pressing the pedestal 36 down against a heated plate 40. The plunger 38 can have a head 42 which approximates the size of the package enclosure, so that the head 42 presses the film resist layer 34 uniformly against the package bottom. The spring activated plunger 38 can be provided with means for measuring the force with which the plunger presses against the resist film 34. Using RISTON M810 it has been found practical to apply a pressure of 360 psi for 10 seconds at a pedestal temperature of 100° C. The resist film 34 may not protect the metallization from etching at the extreme edges of the package bottom, that is, where the package bottom meets the seal ring. This problem is overcome by providing dividing lines 42 (FIG. 4) separating the feedthroughs 14 which extend into the package interior away from the package walls. Thus no patterning of the metal must be done at the edges of the package enclosure so a layer of liquid resist can be painted around the edges of the package interior. Since no patterning of the metal occurs near the edge of the package this painted layer of resist need not be thin and uniform.

The resist layer 34 laminated to the bottom of the package 10 can be exposed to ultraviolet radiation through a photographic mask using, for example, a 1° collimated light source. The collimated light source reduces undesirable interference effects which could result from the photographic plate being out of contact with the resist layer 34. This out-of-contact printing is necessitated by the height of the seal ring. Once exposed and developed, the dry film photoresist layer 34 can be used to pattern the electroplated gold. The gold can be etched, for example, in a mixture of potassium iodide and iodine. The gold can then subsequently be used as a mask to pattern the underlying nickel and tungsten layers. The latter can be etched, for example, in a mixture of nitric and hydrofluoric acids.

Figure 7:
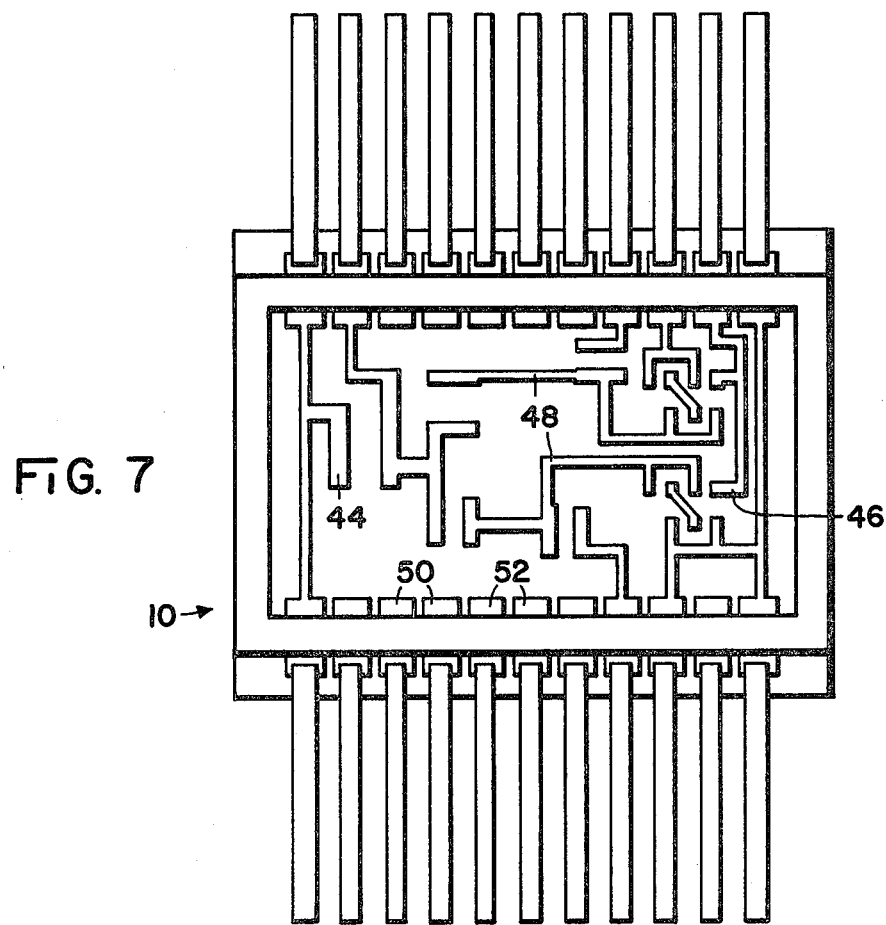
FIG. 7 shows a top view of one completed integrated circuit package.

FIG. 7 shows one example of a completed package. The substrate metallization has been patterned to include die attach area 44, wire bond pad 46, and interconnect metallization 48. This metallization pattern would, of course, be different for different integrated circuit functions, but the package has the inherent flexibility of being adaptable for many circuits.

Thus it is apparent that there has been provided, in accordance with the invention, a hybrid integrated circuit package and a method for fabricating that package that fully satisfy the objects and advantages set forth above. While the invention has been described in conjunction with specific embodiments thereof, it is evident that many alternatives, modifications, and variations will be apparent to those skilled in the art in light of the foregoing description. For example, the size of the package and the metal used in fabricating it could be changed. Likewise, a package has been shown having 22 external leads. This number has been selected to accommodate a large variety of circuit functions, but could be changed to suit a particular application. As shown in FIG. 7, several of the leads, for example, 50, 52 have not been used for this particular circuit. Accordingly, the invention is intended to embrace all such alternatives, modifications and variations that fall within the spirit and broad scope of the appended claims.

What is claimed is:

1. A method for making a hybrid integrated circuit package comprising the steps of:
    providing a ceramic substrate member;
    applying a blank metallized pad to said substrate member;
    applying metallized feedthroughs to said substrate member extending outwardly from said blank metallized pad toward the edge of said substrate member;
    joining a ceramic seal ring to said substrate member to surround said blank metallized pad, said metallized feedthroughs extending outwardly from said seal ring;
    plating said blank metallized pad and said metallized feedthroughs;
    connecting external leads to said feedthroughs; and
    patterning said blank metallized pad surrounded by said ceramic seal ring to accommodate a particular integrated circuit by cutting a piece of dry film photoresist material to the approximate interior dimensions of said seal ring;
    laminating said piece of dry film photoresist material to said blank metallized pad by simultaneously applying pressure and heat to said piece;
    exposing said piece of dry film photoresist material through a photographic mask using a collimated light source; and
    etching said blank metallized pad using said dry film photoresist material as a mask.

2. The method of claim 1 wherein said substrate member and said seal ring are joined by firing at about 1500° C.

3. The method of claim 2 wherein said blank metallized pad and said metallized feedthroughs are electroplated with sequential layers of nickel and gold.

4. A method for making a hybrid integrated circuit package comprising the steps of:
    providing a ceramic substrate member;
    applying a refractory metal pattern to said substrate member, said pattern comprising a substrate pad and electrical feedthroughs;
    attaching a ceramic seal ring member to said ceramic substrate, said ceramic seal ring member extending above said ceramic substrate and surrounding said substrate pad;
    plating a metal layer onto said refractory metal pattern;
    patterning said substrate pad surrounded by said ceramic seal ring member by laminating a preformed piece of dry film photoresist material to said metal layer;
    selectively exposing said dry film photoresist material to ultraviolet radiation and developing said material to form a desired pattern;
    selectively etching the metal layer using said dry film photoresist material as an etch mask.

* * * * *